(12) United States Patent
Cheung

(10) Patent No.: US 9,837,988 B1
(45) Date of Patent: Dec. 5, 2017

(54) DYNAMICALLY ADJUSTABLE DECIMATION FILTER CIRCUITRY

(71) Applicant: Altera Corporation, San Jose, CA (US)

(72) Inventor: Colman C. Cheung, San Diego, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 14/669,501

(22) Filed: Mar. 26, 2015

(51) Int. Cl.
*G06F 17/10* (2006.01)
*H03H 17/02* (2006.01)

(52) U.S. Cl.
CPC ................ *H03H 17/0248* (2013.01)

(58) Field of Classification Search
None
See application file for complete search history.

(56) References Cited

U.S. PATENT DOCUMENTS

| | | | |
|---|---|---|---|
| 5,226,001 A | 7/1993 | Garverick | |
| 5,258,939 A | 11/1993 | Johnstone et al. | |
| 5,880,980 A * | 3/1999 | Rothacher | G06T 3/4023 |
| | | | 708/290 |
| 6,041,338 A * | 3/2000 | Han | H03H 17/0201 |
| | | | 708/313 |
| 6,317,765 B1 | 11/2001 | Page et al. | |
| 6,408,318 B1 | 6/2002 | Fang et al. | |
| 6,427,157 B1 | 7/2002 | Webb | |
| 6,470,365 B1 | 10/2002 | Rahman et al. | |
| 6,718,354 B1 | 4/2004 | Mou | |
| 7,069,285 B2 | 6/2006 | Kawanishi et al. | |
| 7,117,235 B2 | 10/2006 | Cannon | |
| 7,702,710 B2 * | 4/2010 | Domingo | H03H 17/0621 |
| | | | 708/313 |
| 7,949,699 B1 | 5/2011 | Neoh et al. | |
| 8,648,738 B1 | 2/2014 | Ye et al. | |
| 2002/0078114 A1 * | 6/2002 | Wang | H03H 17/0664 |
| | | | 708/313 |
| 2002/0143833 A1 * | 10/2002 | Kawanishi | H03H 17/0664 |
| | | | 708/313 |
| 2004/0078403 A1 * | 4/2004 | Scheuermann | H03H 21/0012 |
| | | | 708/322 |

* cited by examiner

*Primary Examiner* — David H Malzahn
(74) *Attorney, Agent, or Firm* — Treyz Law Group, P.C.; Vineet Dixit; Michael H. Lyons

(57) ABSTRACT

Decimation filter circuitry may include polyphase filtering structures that perform decimation filtering using filter coefficients. Generic polyphase filtering structures do not take advantage of symmetries between the corresponding filter coefficients. If desired, the arrangement of the polyphase filtering structures in the decimation filter circuitry may be optimized relative to generic polyphase filtering structures to take advantage of corresponding filter coefficient symmetries, thereby allowing for implementation of dynamic decimation ratios and a dynamic number of channels while reducing the number of required multipliers by half with respect to generic polyphase filters. Decimation filters may include pre-adder circuitry that receives first and second portions of a data stream and adds corresponding samples from the first and second portions to generate pre-added values. Convolving circuitry may generate filtered output data by convolving the pre-added values with corresponding filter coefficients based on symmetry of the filter coefficients.

23 Claims, 14 Drawing Sheets

DYNAMICALLY ADJUSTABLE DECIMATION FILTER CIRCUITRY

BACKGROUND

This relates generally to filtering circuitry, and more particularly, to dynamically adjustable decimation filter circuitry.

A typical communications link includes a transmitter, a receiver, and a channel that connects the transmitter to the receiver. The transmitter in one integrated circuit transmits a serial data bit stream to the receiver in another integrated circuit via the channel. Typical high-speed transmit data rates are 1 Gbps (gigabits per second) to 10 Gbps. Communications links operating at such high data rates are often referred to as high-speed serial links or high-speed input-output links.

In practice, a system that receives a data stream performs different applications using the data stream that typically require different sample rates of the data stream in real time. Such systems that receive data streams often include decimation filter circuits to filter the received data streams by reducing the sample rate of the data stream to a desired level suitable for a particular application.

Conventional decimation filters perform decimation filtering on received data streams using a number of asymmetric filter coefficients. The asymmetric filter coefficients are convolved with the received data stream by performing a number of multiply operations and addition operations on the data stream and asymmetric filter coefficients in real time. Performing the multiply operations using asymmetric filter coefficients typically requires an excessive number of multiplier circuits on the system, which can occupy valuable chip area and consume excessive system resources.

SUMMARY

Dynamically adjustable decimation filter circuitry is provided. The decimation filter circuitry may be formed on an integrated circuit, for example. The integrated circuit may include control circuitry that controls the decimation filter to implement a desired decimation ratio to reduce the sample rate of a received data stream by a desired amount. The decimation filter circuitry may utilize symmetric decimation filter coefficients to reduce the number of required multiplier circuits relative to scenarios where asymmetric coefficients are used.

The decimation filter circuitry may include polyphase filtering structures that perform decimation filtering using filter coefficients. Generic polyphase filtering structures do not take advantage of symmetries between the corresponding filter coefficients. If desired, the arrangement of the polyphase filtering structures in the decimation filter circuitry may be optimized relative to generic polyphase filtering structures to take advantage of corresponding filter coefficient symmetries, thereby allowing for the implementation of dynamic decimation ratios and a dynamic number of data channels while reducing the number of required multipliers by half with respect to generic polyphase filters.

In order to perform optimized decimation filtering operations using symmetric decimation filter coefficients, the filter circuitry may include pre-adder circuitry that receives first and second portions of a data stream and adds corresponding data samples from the first and second portions of the data stream to generate pre-added values. The decimation filter circuitry may include convolving circuitry (e.g., polyphase filtering circuitry and/or dot-product calculation circuitry) that generates filtered output data having a reduced sample rate by convolving the pre-added values with symmetric decimation filter coefficient values. For example, the circuitry may include multiplier circuitry that generates multiplied values by multiplying the pre-added values by respective coefficient values and summing circuitry that generates a summed value by summing each of the multiplied values. If desired (as in scenarios where an odd number of filter coefficients is used), the filter circuitry may include adder circuitry that adds a selected one of a logic "0" value and a data sample from a third portion of the data stream to the summed value.

The data stream may be formed into multiple phases (e.g., as in polyphase filter). The filter circuitry may include accumulator circuitry that generates the filtered output data by accumulating the summed value of each phase. Each phase may use the same convolving hardware, thereby allowing for efficient chip area consumption in the system.

If desired, the data stream may include multiple data stream channels. In this scenario, the filter circuitry may be shared among all channels in an interleaving fashion. For example, time division multiplexing may be performed between each of the channels (e.g., such that each channel uses the shared circuitry during a corresponding time period). If desired, each channel may have its own corresponding decimation ratio (e.g., different decimation ratios may be used for each channel).

The filtering circuitry may include data buffering circuitry that partitions the received data stream into at least the first and second portions by reordering at least some of the received data stream. The data buffering circuitry may, for example, include a first buffer circuit that stores the first portion of the received data stream, a center buffer circuit that re-orders the second portion of the received data stream, and a second buffer circuit formed on an opposing side of the center buffer that stores the re-ordered second portion of the received data stream such that stored re-ordered second portion of the received data stream exhibits a symmetry about the center buffer circuit with respect to the stored first portion of the received data stream.

Such symmetry may allow the data portions to be aligned with the symmetric coefficient values when provided to the convolving circuitry. For example, the pre-adder circuitry may add data samples from the stored first portion of the received data stream with corresponding samples from the stored reordered second portion of the received data stream based on the symmetry (e.g., the pre-adder may generate a first pre-added value by adding a last data sample from the first portion with a first data sample from the second portion, a second pre-added value by adding a second-to-last data sample from the first portion with a second data sample from the second portion, etc.). The filter may be controlled by control circuitry in real time to exhibit a desired decimation ratio without changing the hardware requirements of the filter. By re-ordering the data using the data buffer circuitry, the data may be aligned with respect to the symmetric filter coefficients such that half as many multiplier circuits need to be used to convolve the data with filter coefficients as in scenarios where asymmetric filter coefficients are used.

Further features of the present invention, its nature and various advantages will be more apparent from the accompanying drawings and the following detailed description.

DETAILED DESCRIPTION

Embodiments of the present invention relate to filtering circuitry, and more particularly, to dynamically adjustable decimation filtering circuitry for performing decimation filtering on data received over communications links. It will be recognized by one skilled in the art, that the present exemplary embodiments may be practiced without some or all of these specific details. In other instances, well-known operations have not been described in detail in order not to unnecessarily obscure the present embodiments.

Communications links are commonly used to convey data between separate integrated circuits packages, printed circuit boards, etc. Such communications links may be used to connect integrated circuits that include communications capabilities, such as memory chips, digital signal processing circuits, microprocessors, application specific integrated circuits, programmable logic device integrated circuits, field-programmable gate arrays, application specified standard products, or any other suitable integrated circuit.

Figure 1:
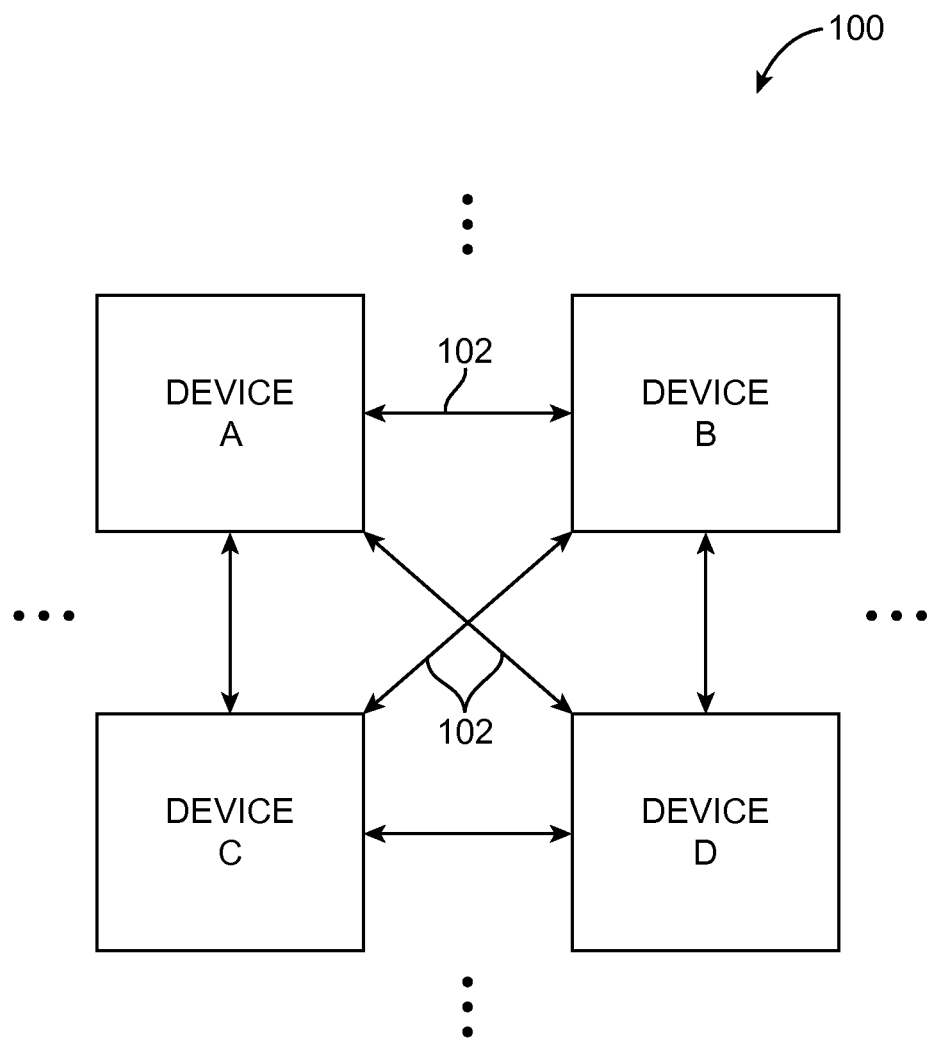
FIG. 1 is a diagram of an illustrative system of integrated circuit devices operable to communicate with one another in accordance with an embodiment of the present invention.

An illustrative system 100 of interconnected electronic devices is shown in FIG. 1. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include basic electronic components and circuits such as analog circuits, digital circuits, mixed-signal circuits, circuits formed within a single package, circuits housed within different packages, circuits that are interconnected on a printed-circuit board (PCB), etc.

Figure 2:
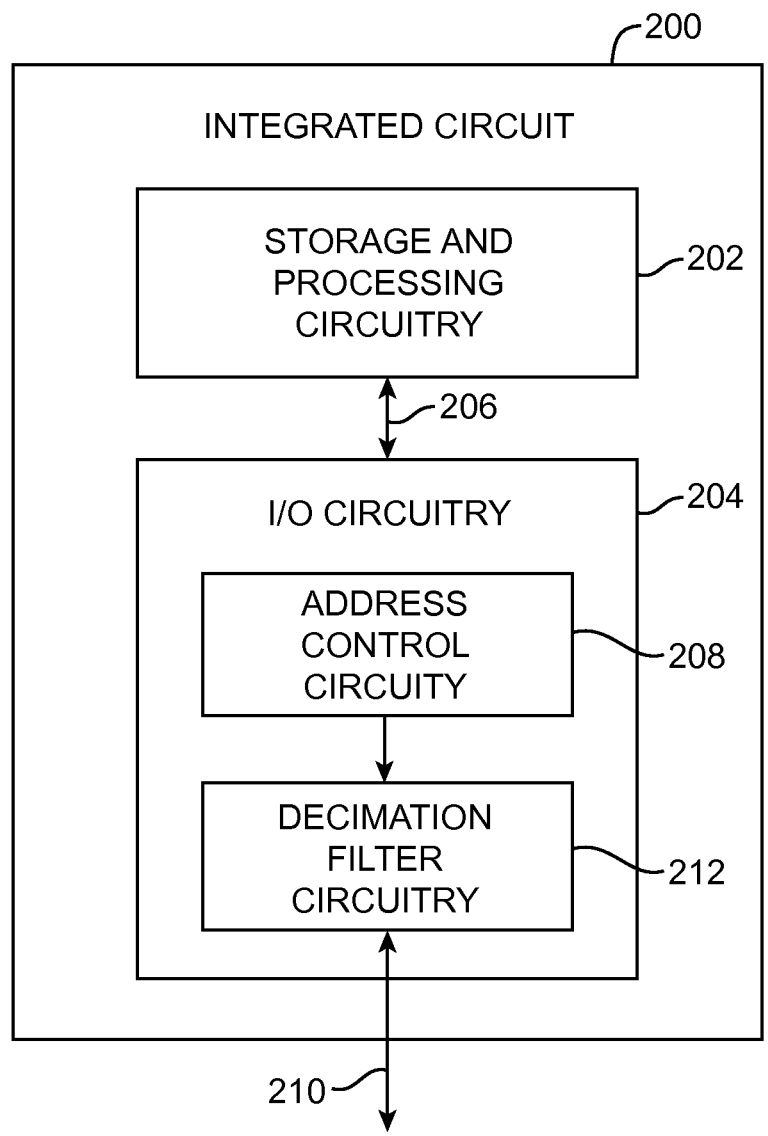
FIG. 2 a diagram of an illustrative integrated circuit that includes input-output circuitry having dynamic decimation filtering circuitry in accordance with an embodiment of the present invention.

An illustrative embodiment of an integrated circuit 200 in accordance with the present invention is shown in FIG. 2. Integrated circuit 200 may include storage and processing circuitry 202 and input-output (IO) circuitry 204. Storage and processing circuitry 202 may include embedded microprocessors, digital signal processors (DSP), arithmetic circuitry, logic circuitry, microcontrollers, or other processing circuitry. The storage and processing circuitry 202 may further include random-access memory (RAM), first-in first-out (FIFO) circuitry, stack or last-in first-out (LIFO) circuitry, read-only memory (ROM), or other memory elements. Internal interconnection resources 206 such as conductive lines and busses may be used to send data from one component to another component or to broadcast data from one component to one or more other components within device 200. External interconnection resources 210 such as conductive lines and busses, optical interconnect infrastructure, or wired and wireless networks with optional intermediate switches may be used to communicate with other devices (see, system 100 of FIG. 1).

IO circuitry 204 may, for example, be a high-speed serial interface (or HSSI) circuit that receive serial data from external interconnection resources 208 and that deserializes the serial data before sending parallel data over internal interconnection resources 206 to storage and processing circuitry 202. High-speed serial interface circuitry 204 may also receive data from storage and processing circuitry 202 over internal interconnection resources 206, serialize the received data, and transmit the serial data over external interconnection resources 208. IO circuitry 204 may include differential buffer circuitry, serial data transceiver circuitry such as receive (Rx) and transmit (Tx) channels and associated phase-locked loop (PLL) circuitry, and/or other suitable communications circuitry for transmitting and receiving data.

IO circuitry may receive a data stream having a particular sample rate (e.g., 20 MHz) from circuitry 202 and/or over link 210. It may be desirable for IO circuitry 204 to perform filtering operations on data (e.g., serial data) received from storage and processing circuitry 202 and/or external interconnection 210. IO circuitry 204 may include filtering circuitry such as decimation filter circuitry 212 that performs decimation filtering operations on the received data so that the data has a desired sample rate prior to transmitting the filtered data to other components (e.g., circuitry 202 and/or external path 210). For example, decimation filter circuitry 212 may perform decimation filtering on a received 20 MHz data stream so that the data stream has a filtered sample rate of 5 MHz. The filtered data stream may be transmitted to external circuitry for performing desired operations on the filtered data stream.

The ratio between the sample rate of the input of decimation filter circuitry 212 and the sample rate of the output of decimation filter circuitry 212 is sometimes referred to herein as the "decimation ratio" of decimation filter circuitry 212. In the example where filter 212 filters a 20 MHz data stream to generate a corresponding 5 MHz data stream, filter 212 exhibits a 4:1 decimation ratio, in an example where filter 212 reduces a 20 MHz data stream to a 10 MHz data stream, filter 212 exhibits a 2:1 decimation ratio, when filter 212 reduces a 40 MHz data stream to a 5 MHz data stream, filter 212 exhibits a 8:1 decimation ratio, etc.

If desired, the decimation ratio implemented by decimation filter circuitry 212 may be dynamically adjusted in real time (e.g., so that a received data stream is provided with a desired sample rate prior to transmission through the system). IO circuitry 204 may include control circuitry such as address control circuitry 208 that provides control signals to decimation filter 212. The control signals provided by address control circuitry 208 may control the decimation ratio provided by decimation filter circuitry 212.

In some scenarios, decimation filtering circuitry 212 performs decimation filtering by convolving a number of asymmetric filtering coefficients with the received data stream to be filtered. Such convolution operations require multiplier circuits to perform multiplication operations on each sample of the data stream by a respective asymmetric filter coefficient. Multipliers that perform multiplication by asymmetric filter coefficients can consume excessive resources and chip area on integrated circuit 200. It may therefore be desirable to be able to provide improved dynamically adjustable decimation filtering circuitry.

If desired, decimation filter circuitry 212 may perform decimation filtering using symmetric filtering coefficients. Filter 212 may convolve the symmetric filtering coefficients with the received data stream using half as many multiplication operations by utilizing symmetry in the filtering coefficients to multiply multiple samples of the received data stream by each given filtering coefficient (whereas asymmetric filtering coefficients require respective multiply operations for each sample). Decimation filter 212 may thereby implement half as many multiplier circuits as systems that perform decimation filtering using symmetric filtering coefficients (and may thereby consume fewer system resources).

In order to perform decimation filtering using symmetric filtering coefficients, the received serial data stream needs to be formatted and reordered prior to convolving the data stream with the symmetric filtering coefficients so that the data aligns with the symmetric filtering coefficients. Decimation filtering circuitry 212 may include data buffering circuitry that performs formatting and reordering operations on the received serial data. Address control circuitry 208 may provide suitable address control signals to the buffer circuitry to perform the desired formatting and reordering operations.

Figure 3:
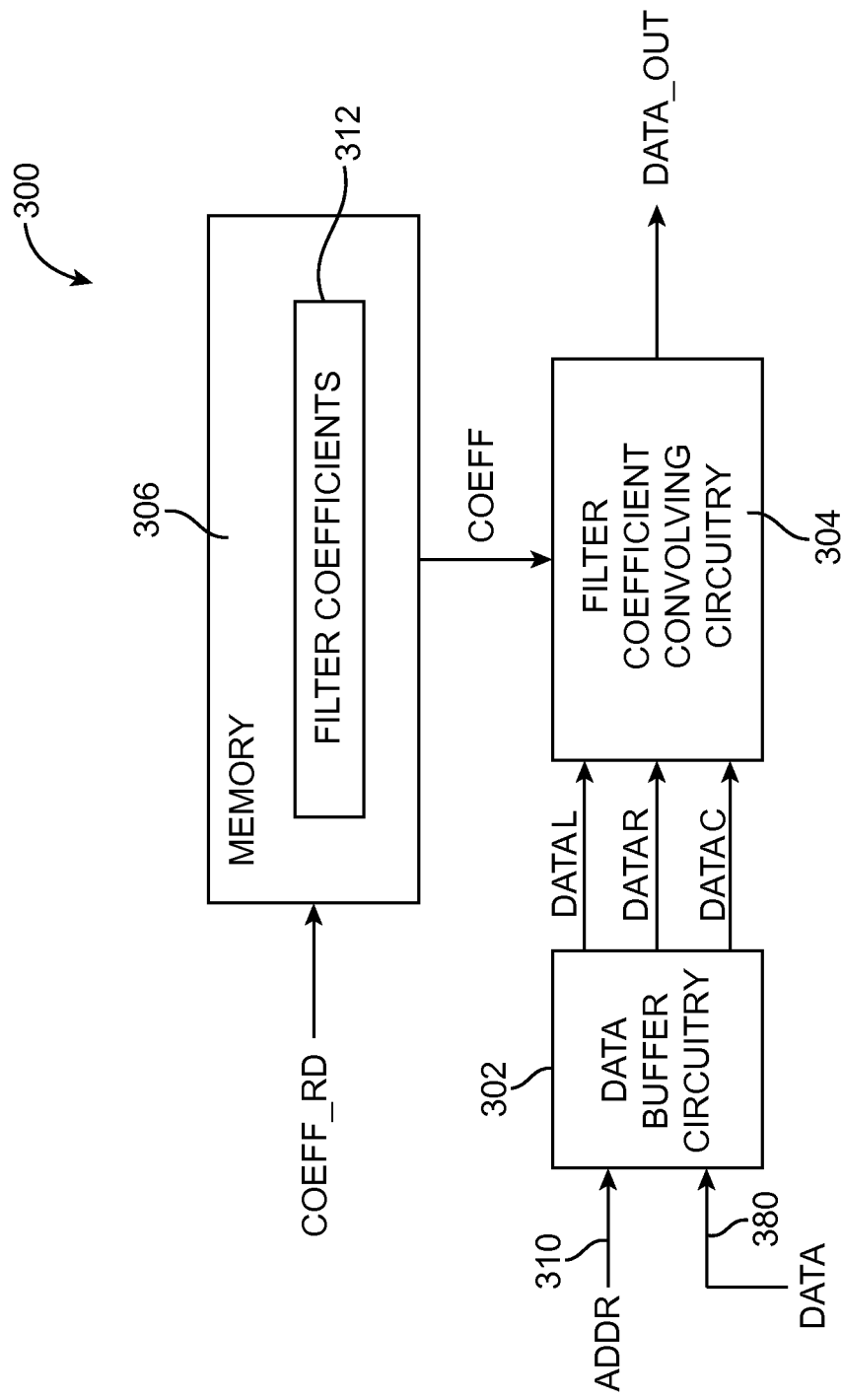
FIG. 3 is a diagram of illustrative dynamic decimation filtering circuitry for performing filtering operations on received data in accordance with an embodiment of the present invention.

FIG. 3 is an illustrative block diagram of dynamically adjustable decimation filtering circuitry that utilizes symmetric filtering coefficients such as decimation filter circuitry 212 of FIG. 2. As shown in FIG. 3, decimation filtering circuitry 300 (e.g., filtering circuitry 212 of FIG. 2) may include data buffering circuitry such as buffer circuitry 302, symmetric coefficient convolving circuitry such as filter coefficient convolving circuitry 304, and storage circuitry such as memory 306. Memory 306 may include random-access memory (RAM), first-in first-out (FIFO) circuitry, stack or last-in first-out (LIFO) circuitry, read-only memory (ROM), or other memory elements.

Data buffer circuitry 302 may receive a serial data stream DATA via a first input 308. Buffer circuitry 302 may receive address control signals ADDR via a second input 310 from address control circuitry 208. Buffer circuitry 302 may store data stream DATA in real time as the data stream is received based on addressing control signals ADDR received from control circuitry 208 (e.g., control signals ADDR may control the writing and reading of data stream DATA on buffer circuitry 302). Buffer circuitry 302 may include one or more buffer circuits for storing, formatting and reordering the received data stream.

Buffer circuitry 302 may perform formatting and reordering operations on serial data stream DATA so that the data stream can be convolved using symmetric filtering coefficients. For example, address control circuitry 208 may control data buffer circuitry 302 (e.g., using addressing signals ADDR) to store data stream DATA in one or more buffer circuits on circuitry 302 in a first order (direction) and may control data buffer circuitry 302 to read at least some of the stored data stream from the one or more buffer circuits in a second order (direction). The data stream that is read from buffer circuitry 302 may be partitioned into three portions DATAL, DATAR, and DATAC (e.g., using three separate buffer circuits within circuitry 302) that may be aligned with the symmetric filtering coefficients. Data stream portions DATAL, DATAR, and DATAC may be output to filter coefficient convolving circuitry 304.

Convolving circuitry 304 may combine data stream portions DATAL, DATAR, and DATAC for performing convolution operations using symmetric filter coefficients. Convolving circuitry 304 may receive symmetric filter coefficients COEFF from memory 306. Circuitry 304 may convolve symmetric coefficients COEFF with the data stream by using each individual coefficient in symmetric coefficients COEFF with a corresponding data sample from both data stream portions DATAL and DATAR. In other words, each symmetric coefficient may be combined with two data values from the serial data stream DATA (e.g., a single value from both portions DATAL and DATAR), thereby reducing the number of multiply operations required relative to scenarios where asymmetric filtering coefficients are used.

Memory 306 may store a number of symmetric filter coefficients 312. Memory 306 may transmit all of filter coefficients 312 or a subset of stored coefficients 312 as coefficients COEFF based on coefficient read control signals COEFF_RD received from address control circuitry 208. In other words, a number of desired symmetric coefficients may be pre-loaded onto memory 306 and address control circuitry 208 may selectively read out desired coefficients COEFF from memory 306 for providing to filter coefficient convolving circuitry 304. If desired, control circuitry 208 may determine a desired decimation ratio and may select a desired subset of stored filter coefficients 312 to read out as coefficients COEFF for implementing the desired decimation ratio (e.g., using coefficient read control signals COEFF_RD). For example, different subsets of coefficients 312 may be involved in implementing different decimation ratios.

Serial data stream DATA received at input 308 may have a first sample rate (e.g., 20 MHz). Coefficient convolving circuitry 304 may convolve received data portions DATAL, DATAR, and DATAC with symmetric coefficients COEFF received from memory 306 to generate filtered data stream DATA_OUT having a second sample rate that is less than or equal to the first sample rate (e.g., 10 MHz, 5 MHz, 20 MHz, depending on the selected decimation ratio). In this way, filtered data stream DATA_OUT may be provided with a desired sample rate prior to transmission through the system. Decimated data stream DATA_OUT may be transmitted to other circuitry for additional processing (e.g., storage and processing circuitry 202 or external path 210 of FIG. 2).

Figure 4:
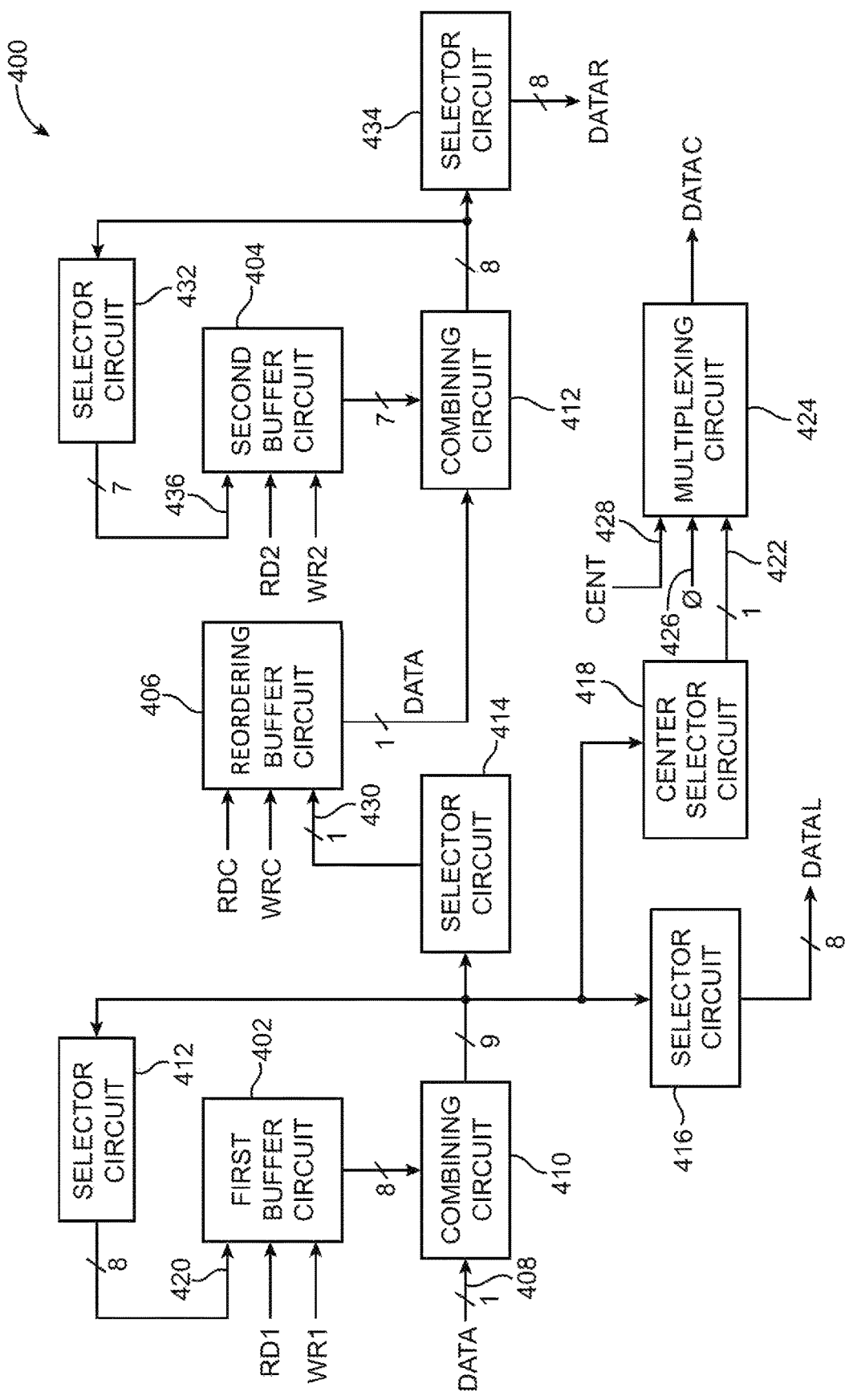
FIG. 4 is a diagram of illustrative data buffer circuitry for performing data formatting and reordering operations to align received data with symmetric decimation filter coefficients in accordance with an embodiment of the present invention.

FIG. 4 is an illustrative block diagram showing how data buffer circuitry 302 performs formatting and reordering operations on the received serial data stream DATA. As shown in FIG. 4, data buffer circuitry 400 (e.g., buffer circuitry 302 of FIG. 3) may include multiple data buffer circuits such as a first data buffer circuit 402, second data buffer circuit 404, and central re-ordering buffer circuit 406 interposed between the first and second data buffer circuits. Buffer circuits 402 and 404 may be controlled to perform desired formatting and alignment operations whereas buffer 406 may be controlled to perform desired reordering on the received serial data stream DATA to allow the data stream to be convolved with symmetric filtering coefficients by partitioning the received data stream DATA into symmetric portions DATAL, DATAR, and DATAC.

Serial data stream DATA may be received by buffer circuitry 300 over input path 308 (e.g., corresponding to input path 308 of FIG. 3). Data stream DATA may be received in a serial fashion one data sample at a time. In the example of FIG. 4, stream DATA is received one bit at a time (e.g., each data sample has one bit of data). In general, any number of bits may be received in a given sample at a time.

Received data bit DATA may be provided to combining circuit 410 via input 408. Combining circuit 410 may combine the data bit DATA with a data output of first buffer circuit 402. In the example of FIG. 4, first buffer circuit 402 outputs eight bits at a time to combining circuit 410. Combining circuit 410 may combine the data bit DATA with the eight bit output of first buffer circuit 402 to generate a nine bit output vector (e.g., a vector that includes the single (most recent) bit of data stream DATA appended to the beginning of the eight bits received from first buffer 402). The nine bit output value may be provided to a first selector circuit 412, a second selector circuit 414, a third selector circuit 416, and a center selector circuit 418.

First selector circuit 412 may remove the last (or oldest) bit of the nine bit output received from combining circuit 410 (e.g., the last bit of the eight bit output of first buffer circuit 402) to produce an eight bit output value that includes the data bit DATA received from input 408 and the first seven bits of the output of first buffer circuit 402. The eight bit output of selector circuit 412 may be provided to data input 420 of first buffer circuit 402.

First buffer circuit 402 may receive addressing signals (e.g., signals ADDR of FIG. 3) such as write pointer signal WR1 and read pointer signal RD1 from address control circuitry 208. Addressing control circuitry 208 may control first buffer circuit 402 using write pointer WR1 to write the eight bit output of selector circuit 412 to memory elements within buffer 402 in a first direction. As buffer 402 fills with the new eight bit data output from selector circuit 412, eight additional bits stored on memory 402 are read out (e.g., using read pointer RD1) to combining circuit 410 for combining with the next bit of received data stream DATA. In this way, serial data stream DATA may be stored in a first direction on first buffer circuit 402 bit-by-bit.

Selector circuit 416 may receive the nine bit output of combining circuit 410 and may remove the last (oldest) bit of the nine bit value (e.g., the last bit of the eight bit output of first buffer circuit 402) to generate an eight bit data portion DATAL (sometimes referred to herein as left data or the left data portion). Data portion DATAL may be provided to convolving circuitry 304 (FIG. 3) for convolving with symmetric coefficients COEFF.

Center selector circuit 418 may receive the nine bit output of combining circuit 410 and may remove all but the last (oldest) bit of the nine bit value (e.g., the data bit DATA concatenated to the beginning of the eight bit output of first buffer 402 by combining circuit 410). Selector circuit 418 may provide the remaining bit to a first input 422 of multiplexing circuitry 424. Multiplexing circuit 424 may receive a constant logic "0" bit via a second input 426 and a control signal CENT via control input 428. Addressing control circuitry 208 (FIG. 2) may provide control signal CENT to control multiplexing circuit 424 to output either a logic "0" bit as data portion DATAC or the data bit output by center selector circuit 418 as data portion DATAC (sometimes referred to herein as center data portion DATAC). Data portion DATAC may be transmitted to convolving circuitry 304. Address control circuitry 208 may select the output of multiplexing circuit 424 so that data portion DATAC has a desired symmetry with respect to data portions DATAL and DATAR for performing convolution operations with symmetric coefficients COEFF.

Selector circuit 414 may receive the nine bit output of combining circuit 410 and may remove all but a selected one of the bits in the nine bit value to output to re-ordering buffer circuit 406. For example, selector circuit 414 may select the second least significant bit of the received nine bit value (e.g., the second least significant bit of the eight bit value output by first buffer circuit 402 that was combined with data bit DATA using combining circuit 410 to generate the nine bit value). Selector circuit 414 may provide the selected bit to data input 430 of re-ordering buffer circuit 406.

Center re-ordering buffer circuit 406 may perform reordering operations on the data received via input 430 such that the output provided to combining circuit 412 appears in an opposite direction with respect to the data DATA received at input 408. Re-ordering buffer circuit 406 may receive addressing signals (e.g., signals ADDR of FIG. 3) such as center write pointer signal WRC and center read pointer signal RDC from address control circuitry 208. Addressing control circuitry 208 may control re-ordering buffer circuit 406 to write the single bit output of selector circuit 414 to memory elements within buffer circuit 406 in the first direction (e.g., the same direction as data is written to first buffer circuit 402). As buffer 406 fills with the data output from selector circuit 414, a bit stored on re-ordering buffer circuit 406 is read out (e.g., using read pointer RDC) to second combining circuit 412. Buffer 406 may be read (e.g., using read pointer RDC) in the opposite direction with respect to the direction in which the data is written (e.g., using write pointer WRC) to allow for use of symmetric filtering coefficients (e.g., to reorder the data). In scenarios where data is stored on buffers 402-406 as a two-dimensional array arranged in rows and columns, re-ordering buffer circuit 406 may reorder the data stored within each column (e.g., may reverse the order of the data within each column).

Second combining circuit 412 may combine the single bit output from re-ordering buffer circuit 406 with a seven bit output from second buffer circuit 404 to generate an eight bit output value (e.g., combining circuit 412 may append or concatenate the data output by re-ordering buffer 406 to the beginning of the seven bit output of buffer 404 to generate the eight bit output). The eight bit output of combining circuit 412 may be provided to selector circuit 432 and selector circuit 434.

Selector circuit 432 may remove the last bit of the eight bit output received from combining circuit 412 (e.g., the last bit of the seven bit output of second buffer circuit 404) to produce a seven bit output value that includes the data bit DATA received from the output of re-ordering buffer 406 and the first six bits of the output of second buffer circuit 404. The seven bit output of selector circuit 432 may be provided to data input 436 of second buffer circuit 404.

Second buffer circuit 404 may receive addressing signals (e.g., signals ADDR of FIG. 3) such as write pointer signal WR2 and read pointer signal RD2 from address control circuitry 208. Addressing control circuitry 208 may control second buffer circuit 404 using write pointer WR2 to write the seven bit output of selector circuit 432 to memory elements within buffer 404 in a second direction that is opposite to the first direction with which data was written to first buffer 302 and re-ordering buffer 406. For example, memory elements in buffers 402-406 may be arranged in rows and columns. Each column may be written from the bottom row to the top row and from the left-most column to the right-most column when writing buffers 402 and 406 in the first direction, whereas each column may be written from the top row to the bottom row and from the left-most column to the right-most column when writing buffer 404 in the second direction.

As buffer 404 fills with the new seven bit data output from selector circuit 432, seven additional bits stored on memory 404 (e.g., the seven oldest bits that were stored on buffer 404 at an earliest time) are read out (e.g., using read pointer RD2) to combining circuit 412 for combining with the next bit of data stream DATA received from re-ordering buffer 406. Selector circuit 434 may receive the eight bit output of combining circuit 412 and may, if desired, flip (reverse) the order of the received eight bit output to generate data portion DATAR so that data portion DATAR is symmetric with respect to data portion DATAL about data portion DATAC (e.g., to align the data for performing pre-addition operations and convolution using symmetric coefficients). For example, selector 434 may reverse the order of the columns of stored data in scenarios where data is stored on buffers 402-406 as a two-dimensional array. Data portion DATAR may be output to convolving circuitry 304. In this way, the original serial data stream 408 may be partitioned into formatted left (DATAL), reordered right (DATAR), and center (DATAC) portions for aligning the data in such a way as to allow convolving with symmetric coefficients COEFF (e.g., using half as many multipliers as in scenarios where asymmetric coefficients are used).

The example of FIG. 4 is merely illustrative and does not serve to limit the scope of the present invention. In general, buffer circuitry 302 may include any desired components arranged in any desired manner. Buffer circuitry 302 may include any desired number of buffer circuits (e.g., three buffer circuits, four buffer circuits, greater than four buffer circuits, etc.) and any other desired circuitry for formatting and reordering serial data stream DATA for convolving the data with symmetric filtering coefficients.

Figure 5:
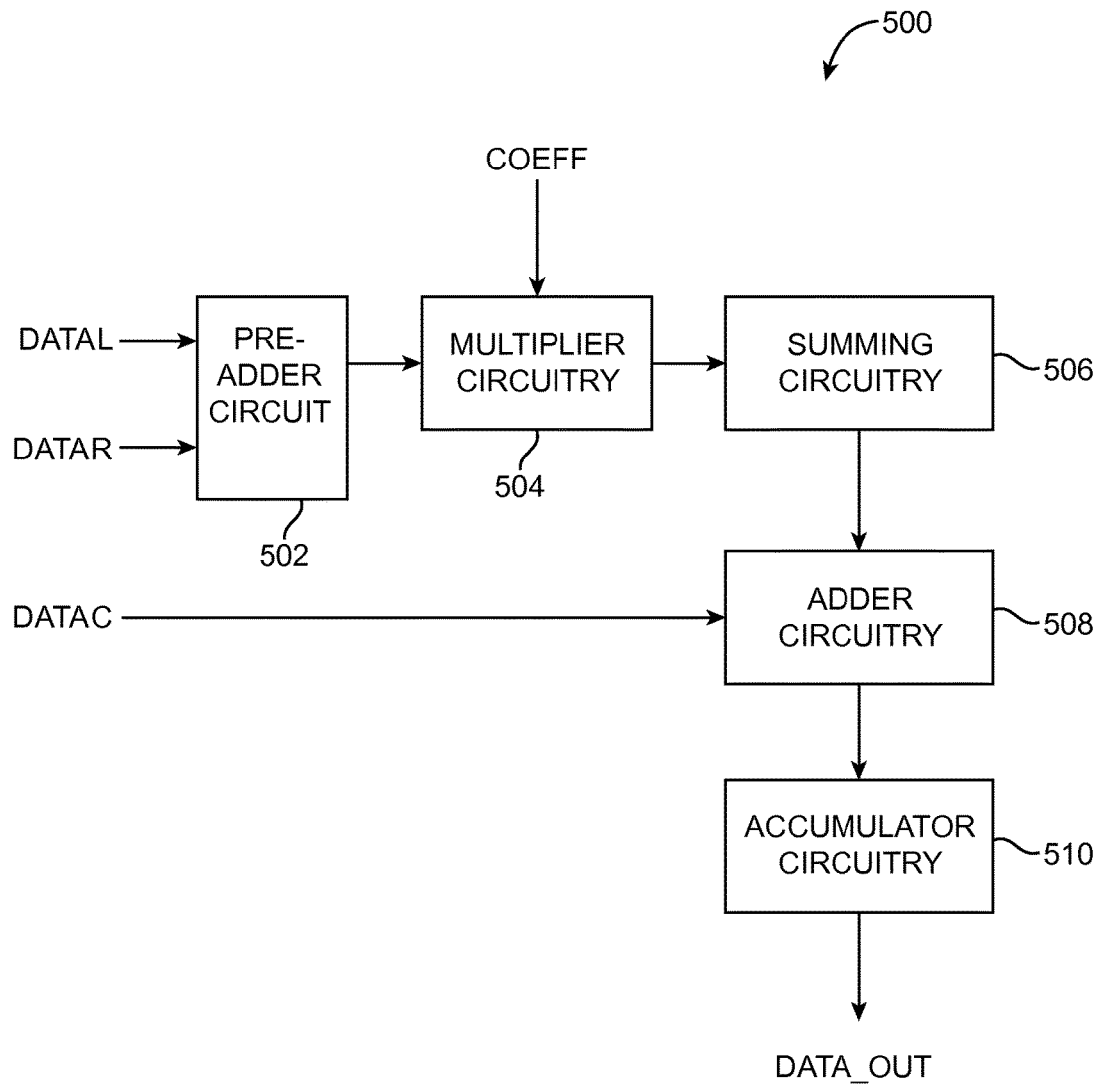
FIG. 5 is a diagram of illustrative pre-adder and convolving circuitry for pre-adding portions of received data taking into account symmetry in the data and for convolving the pre-added data with symmetric decimation filter coefficients in accordance with an embodiment of the present invention.

FIG. 5 is an illustrative diagram of filter coefficient convolving circuitry 304. As shown in FIG. 5, convolving circuitry 500 (e.g., convolving circuitry 304 of FIG. 3) may receive data portions DATAL, DATAR, and DATAC from data buffer circuitry 302. Convolving circuitry 500 may include addition circuitry such as pre-adder circuitry 502 and adder circuitry 508, multiplier circuitry such as multipliers 504, summing circuitry 506, and accumulator circuitry 510.

Pre-adder circuitry 502 may receive data portions DATAL and DATAR from selector circuits 416 and 434, respectively, of data buffer circuitry 302. Pre-adder circuit 502 may perform pre-addition operations on pairs of values in data portions DATAL and DATAR to combine data portions DATAL and DATAR (e.g., to generate pre-added values based on both portions DATAL and DATAR). Each pre-added value therefore includes a contribution from both portions DATAL and DATAR (e.g., includes a combination of two data samples). Pre-adder 502 may provide the pre-added values to multiplier circuitry 504.

Multiplier circuitry 504 may receive the pre-added values from pre-adder 502 and symmetric coefficients COEFF from memory 306 (FIG. 3). Multiplier circuitry 504 may multiply each pre-added value received from pre-adder 502 by a respective symmetric coefficient value. As each pre-added value includes contributions from both a corresponding value in DATAL and a corresponding value in DATAR, only a single multiplication operation needs to be performed for the pair of values from DATAL and DATAR, thereby reducing the number of multiply operations by half with respect to scenarios where asymmetric filtering coefficients are used. Multiplier circuitry 504 may convey each pre-added value that has been multiplied by a corresponding symmetric coefficient to summing circuitry 506. Summing circuitry 506 may sum each of the multiplied pre-added values to generate a single sum value for each portion of DATAL/DATAR received. Multiplier circuitry 504 and summing circuitry 506 may sometimes be referred to herein collectively as a polyphase filter, dot-product circuitry, or convolving circuitry. The polyphase filter formed by circuitry 504 and 506 may implement half as many multiplier circuits as traditional polyphase filters operated with asymmetric filtering coefficients. The same multipliers may be used to perform multiplication for each set of portions DATAL/DATAR/DATAC that is received.

In the example where DATAL and DATAR each include eight samples (the scenario in which each sample includes one bit is shown in FIG. 4), pre-adder circuit 502 may add the first sample from DATAL with the first sample from DATAR to generate a first pre-added value, may add the second sample from DATAL with the second sample from DATAR to generate a second pre-added value, may add the third sample from DATAL with the third sample from DATAR to generate a third pre-added value, etc. Multiplier circuitry 504 may multiply the first pre-added value by a first symmetric filtering coefficient to generate a first multiplied value, may multiply the second pre-added value by a second symmetric filtering coefficient to generate a second multiplied value, may multiply the third pre-added value by a third symmetric filtering coefficient to generate a third multiplied value, etc. Summing circuitry 506 may sum the first, second, third, through eighth multiplied values generated by multiplier circuitry 504 to generate a summed value for that data portion DATAL and DATAR. Circuitry 500 may generate additional summed values for additional portions DATAL and DATAR that are received.

Adder circuitry 508 may receive the summed value from summing circuitry 506 and may add the summed value to data value DATAC output by multiplexing circuit 424 of FIG. 4. For example, adder circuit 508 may add the summed value with zero or the output of center selector circuit 418 based on control signal CENT received by multiplexing circuit 424 (depending on which row of data stored on buffers 402-406 is received). The output of adder circuitry 508 may be coupled to accumulator circuitry 510. Accumulator circuitry 510 may accumulate the output of adder 510 with output values from other filtering channels.

In the example of FIGS. 3-5, decimation filter 212 performs filtering on only a single channel of received data. This is merely illustrative. In many scenarios, the received data is in the form of multi-channel data (e.g., wireless multi-channel data, etc.). For example, filter 212 may handle 16 data channels of 20 MHz each and/or 8 channels at 40 MHz each. In general, decimation filter 212 may perform filtering on any desired number of channels of received data. Buffer circuits 402-406 may each include additional memory elements (e.g., additional rows of memory elements) for storing, formatting and reordering additional channels of received data (e.g., received over additional inputs). Multiplier circuitry 504 may, if desired, be shared by each channel of data. Accumulator circuitry 510 may accumulate the outputs of adder circuit 508 for each channel to generate a single output value DATA_OUT. In scenarios where only a single phase or row is used, accumulator circuit 510 may be omitted.

Output data DATA_OUT may have a sample rate that is less than the sample rate of the received DATA by the selected decimation ratio. By performing re-ordering of the data stream using buffer circuitry 302, pre-addition using pre-adder circuit 502, and polyphase filtering using circuitry 504 and 506 with symmetric filtering coefficients, filtering circuitry 300 may perform decimation filtering with a desired and dynamically adjustable decimation ratio using half as many multiplier circuits as asymmetric filter coefficient decimation circuitry. Filtering circuitry 212 may be generalized to any desired number of data channels without increasing the number of multipliers without departing from the scope and spirit of the present invention.

Figure 6:
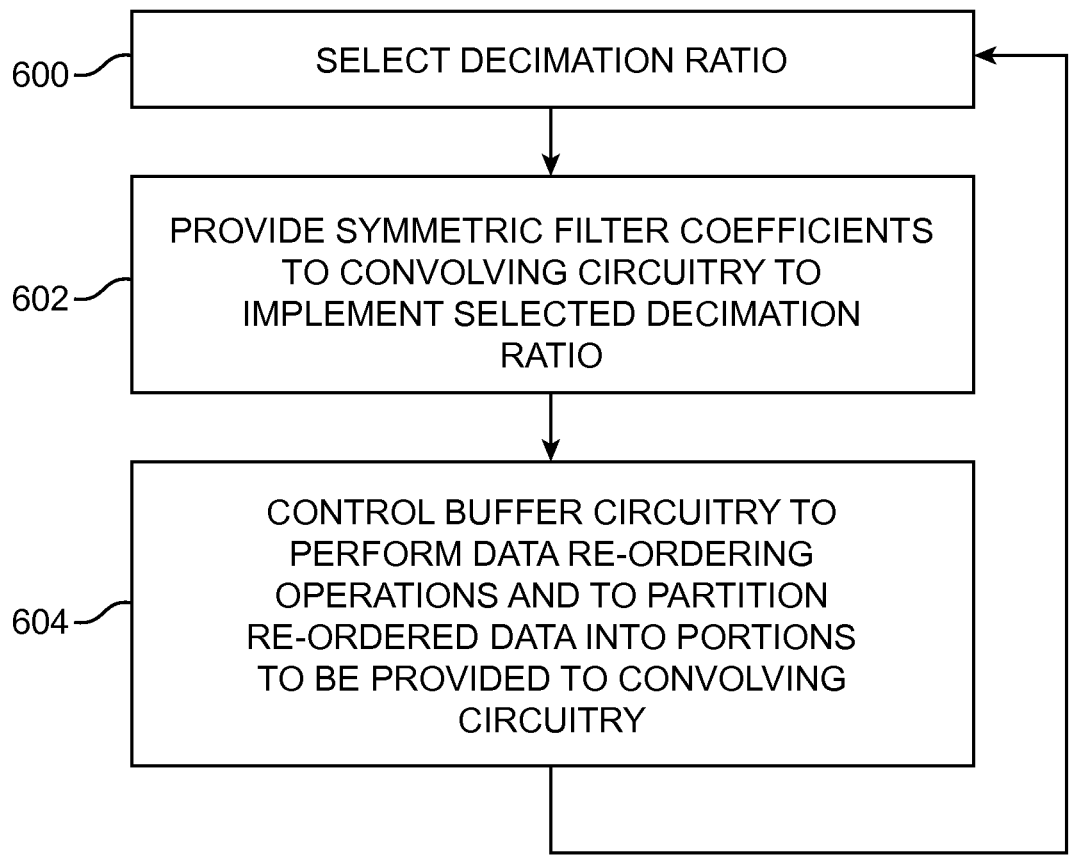
FIG. 6 is a flow chart of illustrative steps that may be performed by address control circuitry for controlling a dynamic decimation filter to dynamically filter received data using a selected decimation ratio in accordance with an embodiment of the present invention.

FIG. 6 is a flow chart of illustrative steps that may be performed by address control circuitry 208 to perform dynamic decimation filtering operations on data received at IO circuitry 204. The steps of FIG. 7 may, for example, be performed by control circuitry 208 concurrently with, prior to, or after a stream of serial data is received by IO circuitry 204.

At step 600, addressing circuitry 208 may receive (e.g., from user input or upper layer system control) a desired decimation ratio and may generate corresponding buffer controls for decimation filter circuitry 212. For example, addressing circuitry 208 may select (e.g., implement) a decimation ratio so that output data DATA_OUTPUT has a desired sample rate as required by an application running on integrated circuit 200 or external to integrated circuit 200 that is to receive the output data. As an example, circuitry 208 may select a decimation ratio of 4:1, 2:1, 1:1, 8:1, 16:1, etc. This is merely illustrative and, in general, there is no limitation on the possible set of decimation ratios. Different decimation requirements may require different partitions of rows and columns of coefficients and data.

At step 602, addressing circuitry 208 may provide—control signals COEFF_RD to memory 306 on decimation filter 212 that instruct memory 306 to provide desired symmetric filter coefficients COEFF to convolving circuitry 304 that implement the selected decimation ratio. For example, circuitry 208 may control memory 306 to provide a first set of coefficients to convolving circuitry 304 to implement a 4:1 decimation ratio, may provide a second set of—coefficients to convolving circuitry 304 to implement a 2:1 decimation ratio, etc.

At step 604, addressing circuitry 208 may control buffer circuitry 302 to perform data formatting and re-ordering operations on data received over input 308. For example, addressing circuitry 208 may control buffers 402-406 to write and read the received data and to partition the data in such a way that data portions DATAL, DATAR, and DATAC are provided to convolving circuitry 304. Convolving circuitry 304 may perform pre-addition operations on the received data portions and may perform polyphase filtering on the pre-added values to generate data output DATA_OUT that has a reduced sample rate given by the selected decimation ratio. If desired, processing may loop back to step 700 to select a new decimation ratio in real time. In this way, filter 212 may be controlled to implement and dynamically adjust the decimation ratio.

Figure 7:
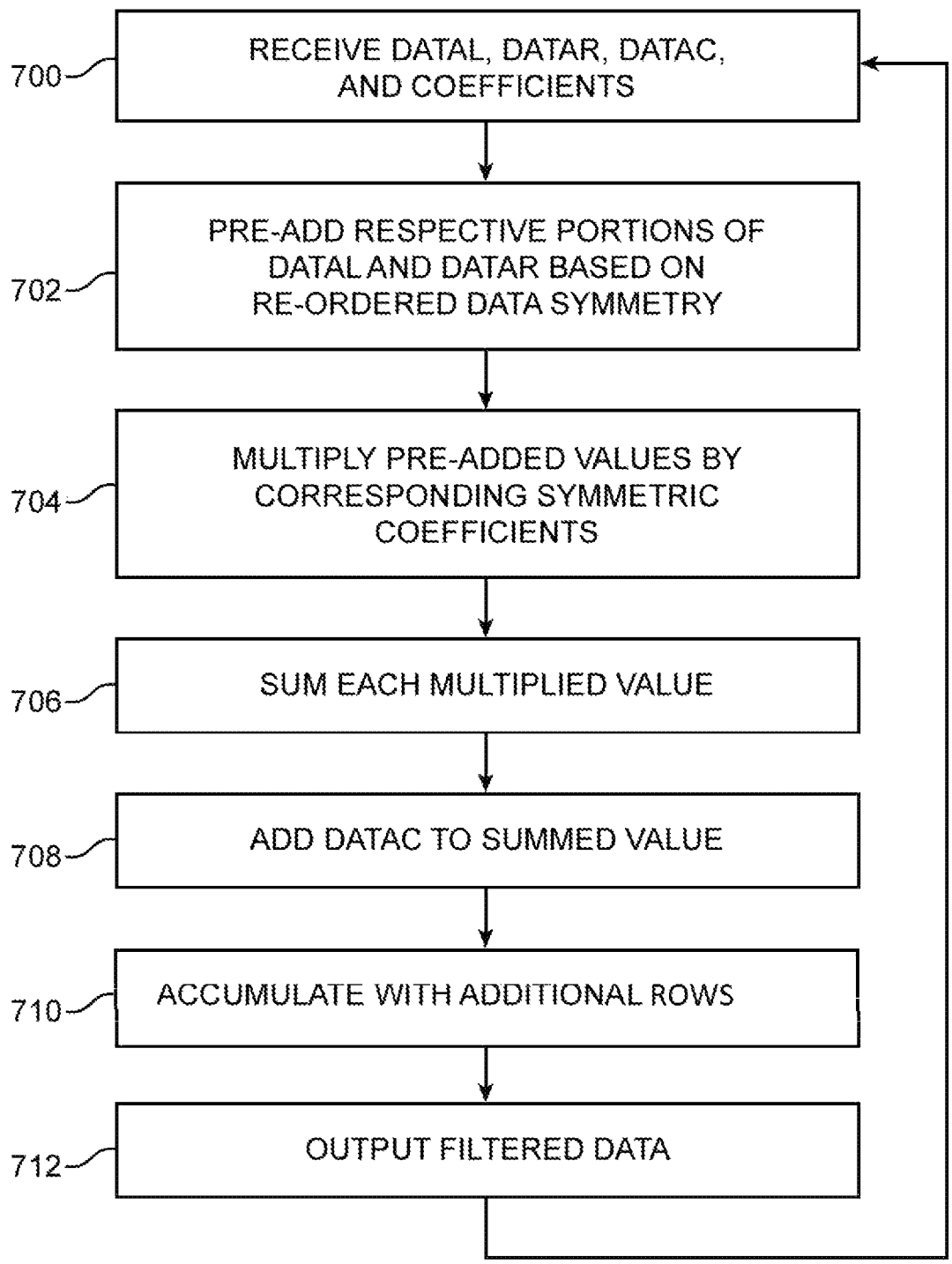
FIG. 7 is a flow chart of illustrative steps that may be performed by pre-adder and convolving circuitry for pre-adding portions of received data taking into account symmetry in the data and for convolving the pre-added data with symmetric decimation filter coefficients for implementing a selected decimation ratio in accordance with an embodiment of the present invention.

FIG. 7 is a flow chart of illustrative steps that may be performed by convolving circuitry 304 of FIG. 3 (e.g., circuitry 500 of FIG. 5). The steps of FIG. 7 may, for example, be performed by circuitry 500 after addressing circuitry 208 has performed step 604 of FIG. 6 for a given set of received data.

At step 700, convolving circuitry 500 may receive data portions DATAL, DATAR, and DATAC from data buffer circuitry 302 (e.g., circuitry 400 of FIG. 4) and coefficients COEFF from memory 306. Each data portion may include a number of data elements (samples). For example, data portions DATAL and DATAR may each include eight samples.

At step 702, pre-adder circuitry 502 may perform pre-addition operations on data portions DATAL and DATAR. For example, circuitry 502 may add a first data element (sample) from DATAL with a first element from DATAR to generate a first pre-added value, may add a second data element from DATAL with a second element from DATAR to generate a second pre-added value, etc. The pre-added values may be passed to multiplier circuitry 504.

At step 704, multiplier circuitry 504 may multiply each pre-added value by a corresponding symmetric coefficient value COEFF. For example, circuitry 504 may multiply the first pre-added value by a first coefficient value to generate a first multiplied value, may multiply the second pre-added value by a second coefficient value to generate a second multiplied value, etc. The multiplied values may be provided to summing circuitry 506.

At step 706, summing circuitry 506 may sum each of the multiplied values received from circuitry 504 for the corresponding data portions DATAL and DATAR to generate a single summed value. Summing circuitry 506 may pass the summed value to adder 508. In scenarios where the number of filter coefficients is even, step 706 may be omitted.

At step 708, adder circuitry 508 may add the value of DATAC to the summed value received from summing circuitry 506 to generate a final sum value. Adder 508 may pass the final sum value to optional accumulator circuitry 510.

At step 710, accumulator circuitry 510 may accumulate the final sum value with final sum values generated for other phases or rows of the received data. In scenarios where only one phase of data is received, step 710 (and accumulator 510) may be omitted.

At step 712, convolving circuitry 304 may output filtered data DATA_OUT and IO circuitry 204 may transmit filtered data DATA_OUT to external path 210 and/or processing circuitry 202. If desired, processing may loop back to step 800 as data is received by IO circuitry 204 to continue to perform dynamic filtering operations.

Figure 8:
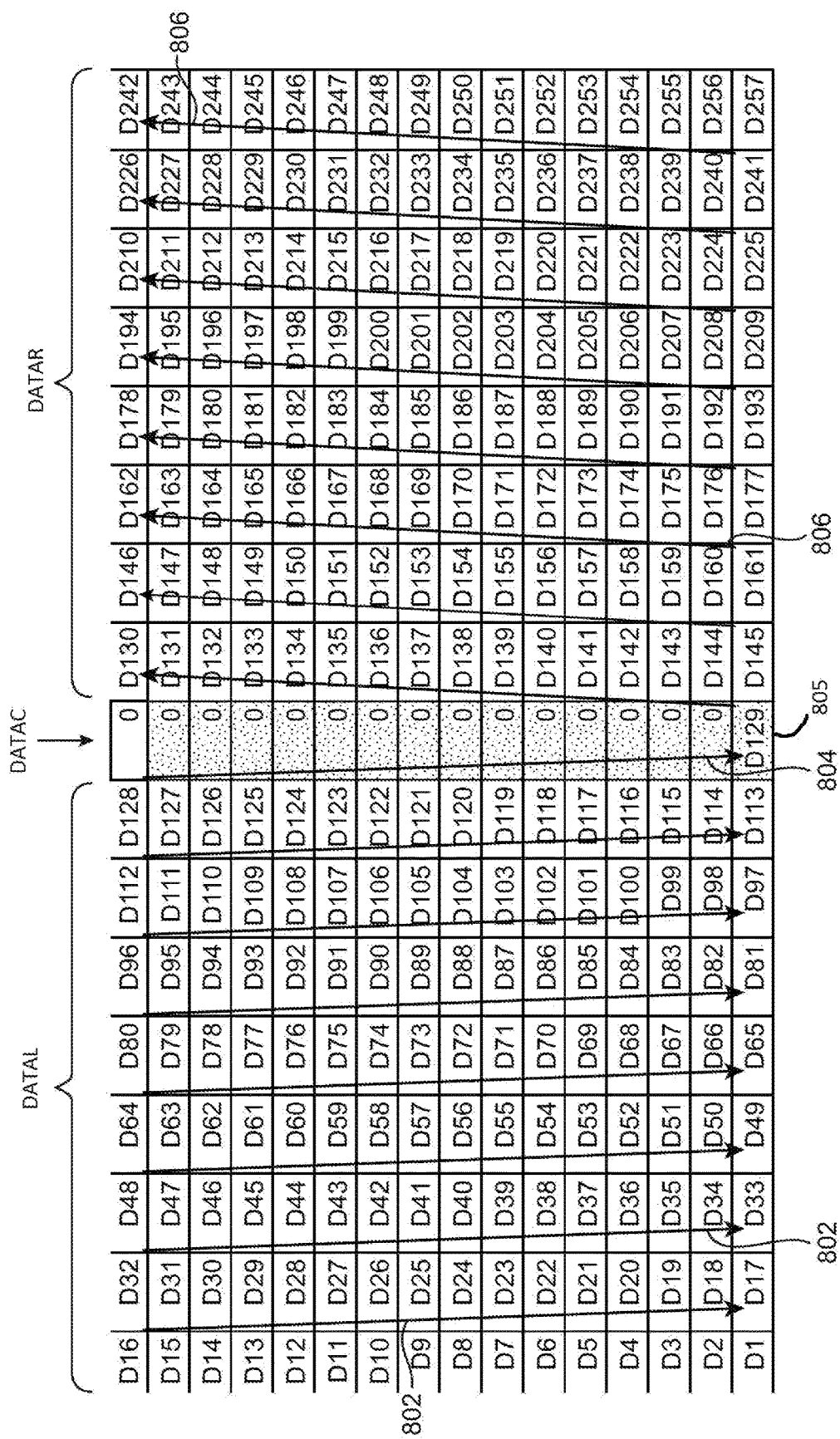
FIG. 8 is an illustrative diagram showing how data buffer circuitry of the type shown in FIG. 4 may format and reorder received data by loading the data into multiple buffers in different directions to align the received data with symmetric decimation filter coefficients (e.g., in a scenario in which one channel is used) in accordance with an embodiment of the present invention.

FIG. 8 is an illustrative diagram showing how data may be loaded onto buffers 402-406 in opposing directions for aligning the data with symmetric coefficients COEFF received from memory 306. As shown in FIG. 8, first buffer circuit 402 may store a number of data elements D (e.g., the most recent data element D1, a second most recent data element D2, a 128$^{th}$ most recent data element D128, etc.) on respective memory elements (cells) (e.g., data element D128 may have been loaded onto buffer circuit 402 prior to loading data element D127, etc.). Data elements D may be loaded onto buffer 402 in a first direction as shown by arrows 802 (e.g., memory elements in array 402 may be loaded from the bottom (first) row to the top (last row) and from the left (first) column to the right (last) column) (e.g., using addressing control signals WR1 received from address control circuitry 208 while processing step 604 of FIG. 6). Rows of data elements D may be output by buffer 402 via selector circuit 416 as data portions DATAL (see, e.g., FIG. 4).

If desired, the received data may be stored in a number of rows on buffer 402 that corresponds to the selected decimation ratio to be used by filter 212. In the example of FIG. 8, buffers 402-406 are used to implement a 16:1 decimation ratio, because there are 16 rows of memory elements in buffers 402-406. As data is loaded onto buffer 402, buffer 402 is filled such that data element D129 was the first (oldest) data element loaded onto buffer 402, whereas element D1 is the last (newest) data element loaded onto buffer 402.

Certain data elements of left buffer 402 may be fed to re-ordering buffer 406 for reordering (e.g., using addressing control signals WRC received from control circuitry 208). Data elements may be read out from re-ordering buffer 406 such that the data elements are provided to second buffer 404 (e.g., based on read signals RDC received from control circuitry 208) and loaded onto second buffer 406 in a second order that is different from the first order with which elements are loaded onto buffer 402. Such reordering may allow for alignment of the partitioned data portions with the symmetric filter coefficients.

For example, data elements D are loaded onto second buffer 404 in the second direction as shown by arrows 806 (e.g., memory elements in array 404 may be loaded from the top (last) row to the bottom (first row) and from the left (first) column to the right (last) column of array 404). By controlling buffers 406 and 404 to load the data in a reverse order with respect to the data loaded into buffer 402 (e.g., loading arrows 802 and 806 are in opposing directions), addressing circuitry 208 may ensure that data in first buffer 402 is aligned with data in second buffer 404 about center data 805 (e.g., to ensure symmetry in each row around the center column). Such symmetry may allow convolving circuitry 500 to pre-add data elements in each row based on the symmetry about center data 805 so that only a single multiply operation need be performed for each row of data across buffers 402-406 when convolving the data.

Data stored in buffer 402 may be read out as data portions DATAL and DATAC and data stored in buffer 404 may be read out as data portion DATAR. By aligning the data across three buffers with respect to center data 805 (e.g., by reordering the data prior to supplying the data to second buffer 404), each element in a given row of DATAL may be pre-added with a corresponding element in the given row of DATAR based on the symmetry about buffer 406 for multiplying the pre-added value with a corresponding symmetric filter coefficient. The arrangement of data storage in buffers 402-406 may sometimes be referred to herein as a 2-dimensional mapping of folded symmetric coefficients.

Figure 9:
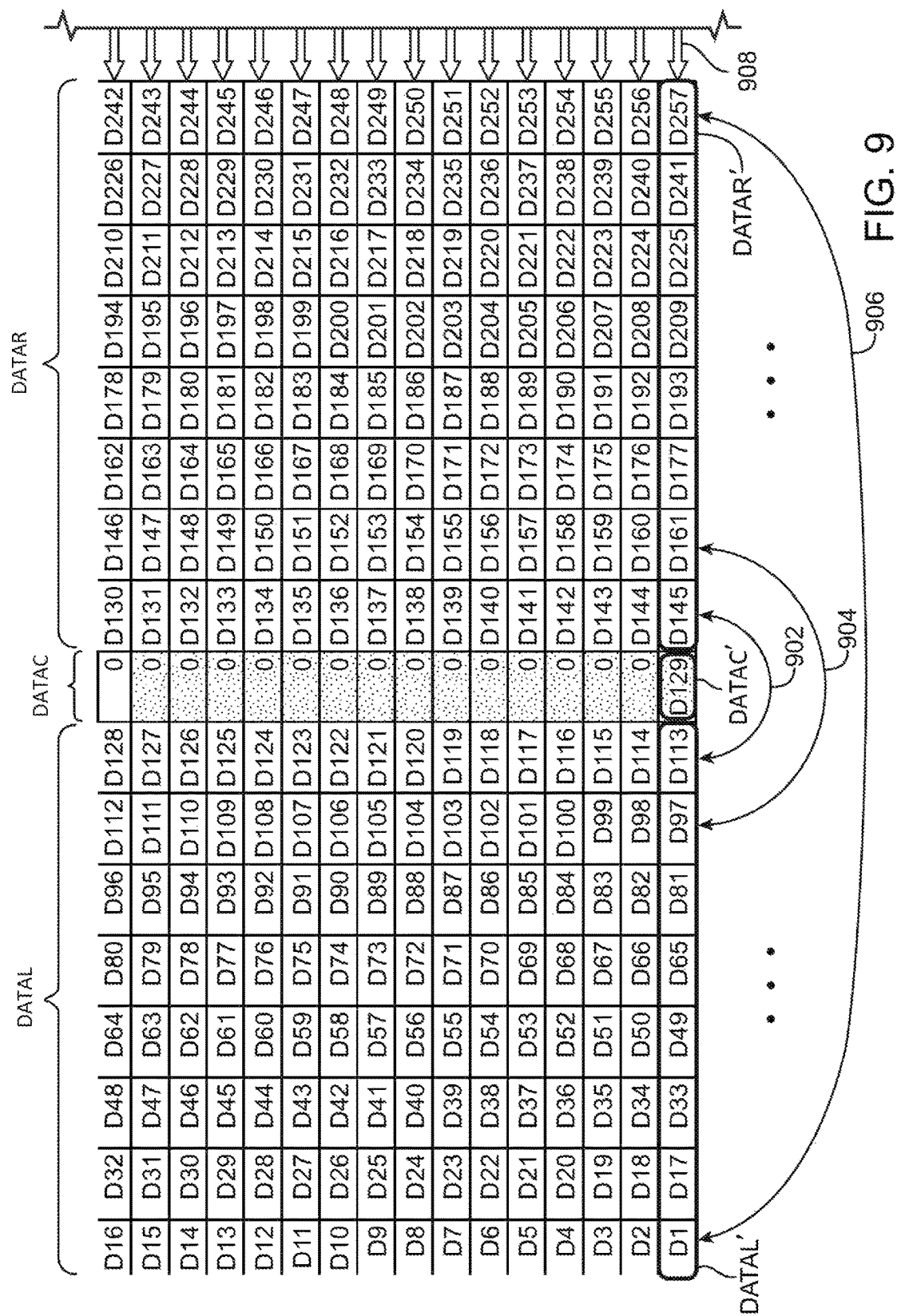
FIG. 9 is an illustrative diagram showing how data buffer circuitry of the type shown in FIGS. 4 and 8 may perform pre-addition operations on rows of stored data elements about a center buffer and convolving operations on the pre-added values with a corresponding row of symmetric decimation filter coefficient values in accordance with an embodiment of the present invention.
Figure 9:
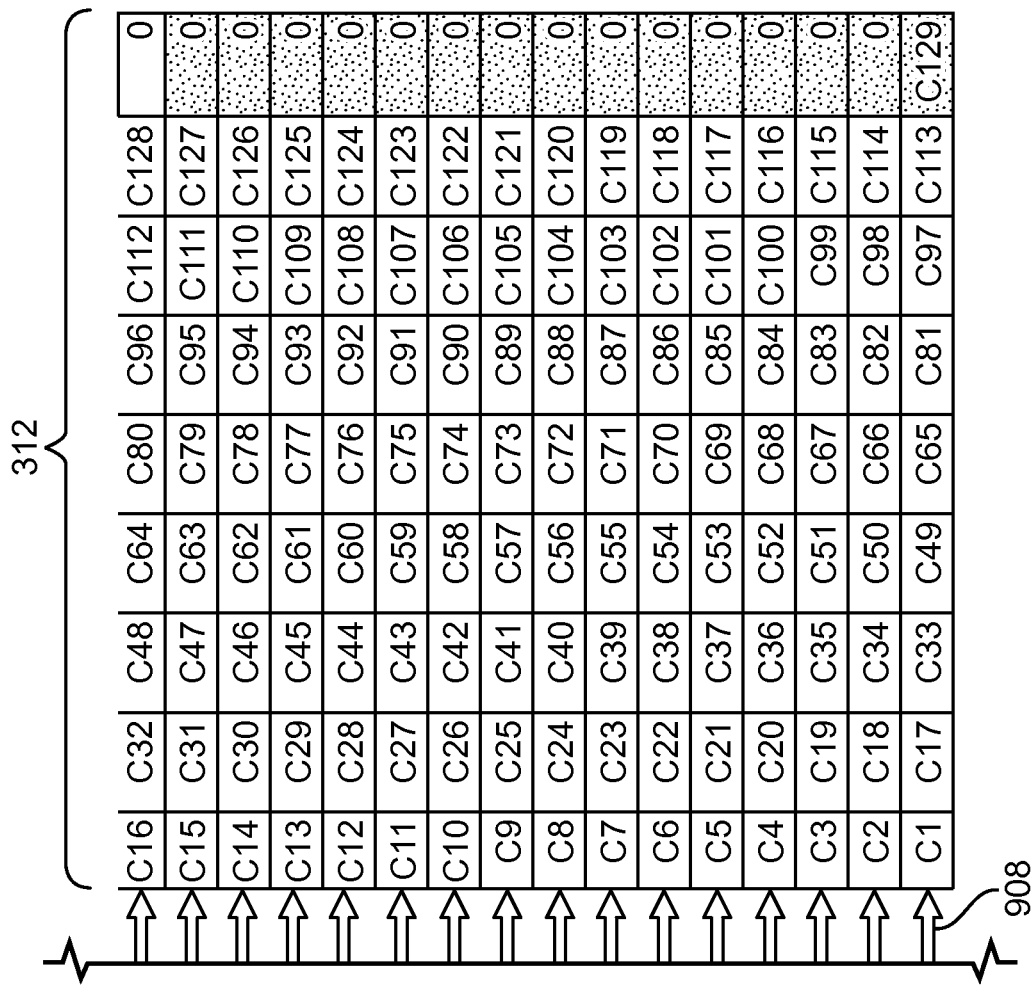

FIG. 9 is an illustrative diagram showing how the reordered data stored on buffers 402 and 404 may utilize symmetry with respect to center data 805 for performing pre-addition operations and convolving the pre-added values with corresponding filter coefficients. As shown in FIG. 9, data elements D1-D129 may be stored on first buffer 402, and data elements D130-D257 may be stored on second buffer 404 at a given point in time. By performing reordering operations, the data elements stored on buffer 404 may be symmetrically aligned with respect to the data elements stored on buffer 402 about center data 805.

Each row of data elements DATAL' in buffer 402 may be read out of circuit 402 via selector 416 as respective values of data portion DATAL and each row of data elements DATAR' may be read out of circuit 402 via selector 434 as respective values of data portion DATAR (e.g., rows of DATAL' may collectively form data portion DATAL whereas rows of DATAR' may collectively form data portion DATAR). As shown in FIG. 9, at a given instance, the first row of buffer 402 may be provided as left data portion DATAL' to convolving circuitry 500 whereas the first row of buffer 404 may be provided as right data portion DATAR' to convolving circuitry 500. Data value D129 may be provided as data portion DATAC' (e.g., a respective value of DATAC read out over center selector 418 and multiplexing circuit 424) to convolving circuitry 500 (when other rows are being read out, DATAC' may be set to 0).

Pre-adder circuit 502 may add a respective data element from each buffer in the first row of buffers 402 and 404 based on the symmetry about center data 805. For example, adder circuit 502 may add data element D113 in left portion DATAL' with data element D145 in right portion DATAR' to generate a first pre-added value as shown by arrow 902, adder circuit 502 may add data element D97 with data element D161 to generate a second pre-added value as shown by arrow 904, may add data element D1 with element D257 to generate an eighth pre-added value as shown by arrow 906, etc. Multiplier circuitry 504 and summing circuitry 506 may perform dot-multiplication on the pre-added elements of the first row with the first row of coefficients 312 (e.g., coefficient values C1, C17, C33 . . . C129 received from memory 306) as shown by arrow 908. For example, the first pre-added value may be multiplied by coefficient C1 and added to the product of the second pre-added value and coefficient C17, the product of the third pre-added value and coefficient C33, the product of the eighth pre-added value and coefficient C113, etc. (e.g., summing circuitry 506 may output a value to adder circuitry 508 that is equal to (D113+D145)*C1+(D97+D161)*C17+(D81+D177)*C33+ (D65+D193)*C49+ . . . +(D1+D257)*C113). This process may be repeated for each row of buffers 402-406 and for each row of coefficients 312. In this approach, the stored data is arranged in a 2-dimensional structure where each row of buffers 402-406 may represent a corresponding sub-filter, for example.

The resulting output value may have a sample rate that is less than the sample rate of the original data loaded onto buffers 402-404. In the example of FIG. 9, filtering circuitry 212 performs decimation filtering with a 16:1 decimation ratio. If each clock cycle operates on one phase, the convolution will be complete in 16 clock cycles (e.g., the sixteen arrows 908 represent the sixteen convolutions performed on the sixteen rows of stored data and each of the sixteen rows of coefficients to implement a 16:1 decimation ratio). This example is merely illustrative. In general, address control circuitry 208 may dynamically adjust the decimation ratio provided by filtering circuitry 212.

Figure 10:
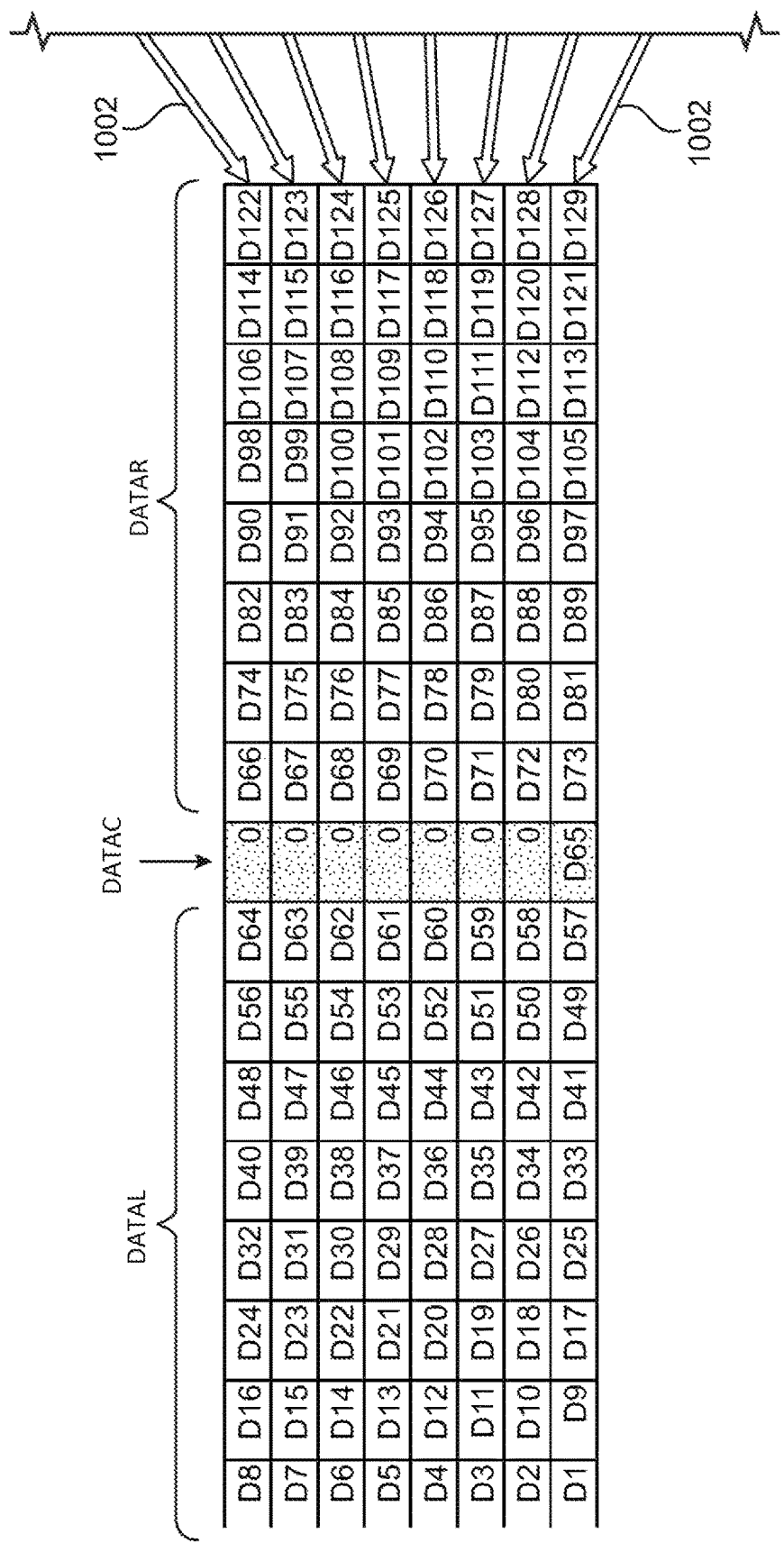
FIG. 10 is an illustrative diagram showing how address control circuitry may control convolving circuitry to perform pre-addition operations and convolving operations using a subset of symmetric decimation filter coefficients to implement a desired decimation ratio in accordance with an embodiment of the present invention.
Figure 10:
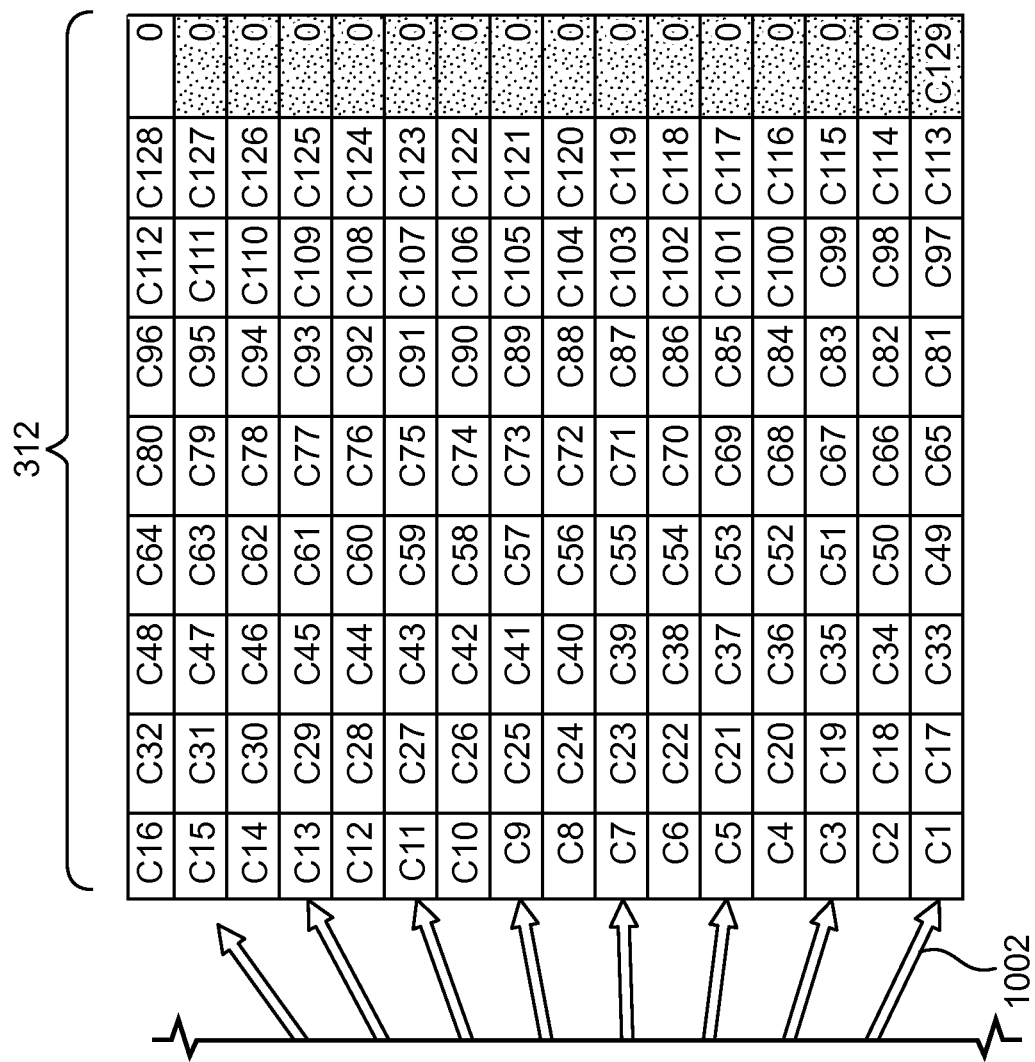

FIG. 10 is an illustrative diagram showing how filtering circuitry 212 may perform decimation filtering with an 8:1 decimation ratio (e.g., so that the filtered data has a suitably lowered sample rate). As shown in FIG. 10, data elements D1-D64 may be read as data portion DATAL from first buffer 402 via selector 416 in the first direction whereas data elements D66-D129 are read from second buffer 404 as data portion DATAR in the second direction. Arrows 1002 represent symmetric pre-addition and convolving with a corresponding row of coefficients 312 (e.g., generation of pre-added values about center data 805, multiplication by corresponding coefficient values, and summing). For example, the elements in the first row of portion DATAL (e.g., as read out from circuit 402 via selector 416) and the first row of portion DATAR (e.g., as read out from circuit 404 via selector 434) may be pre-added about data 805 and dot multiplied with the coefficients in the first row of coefficient array 312, the elements in the second row of DATAL as read from buffer 402 via selector 416 and the second row of DATAR as read from buffer 404 via selector 434 may be pre-added about data 805 and dot multiplied with the coefficients in the third row of coefficients 312, etc.

Address control circuitry 208 may control memory 306 so that a subset of the stored coefficients 312 are provided to convolving circuitry 500 such that a desired decimation ratio is achieved. As the example of FIG. 10 involves an 8:1 decimation ratio, control circuitry 208 controls memory 306 such that only eight rows of coefficients 312 are provided to circuitry 500 and convolved with the rows of data stored on buffers 402-406 (e.g., every-other row of coefficients 132 may be used or any other eight rows of coefficients 132). If each clock cycle operates on one phase, the convolution will be complete in 8 clock cycles in this example.

Figure 11:
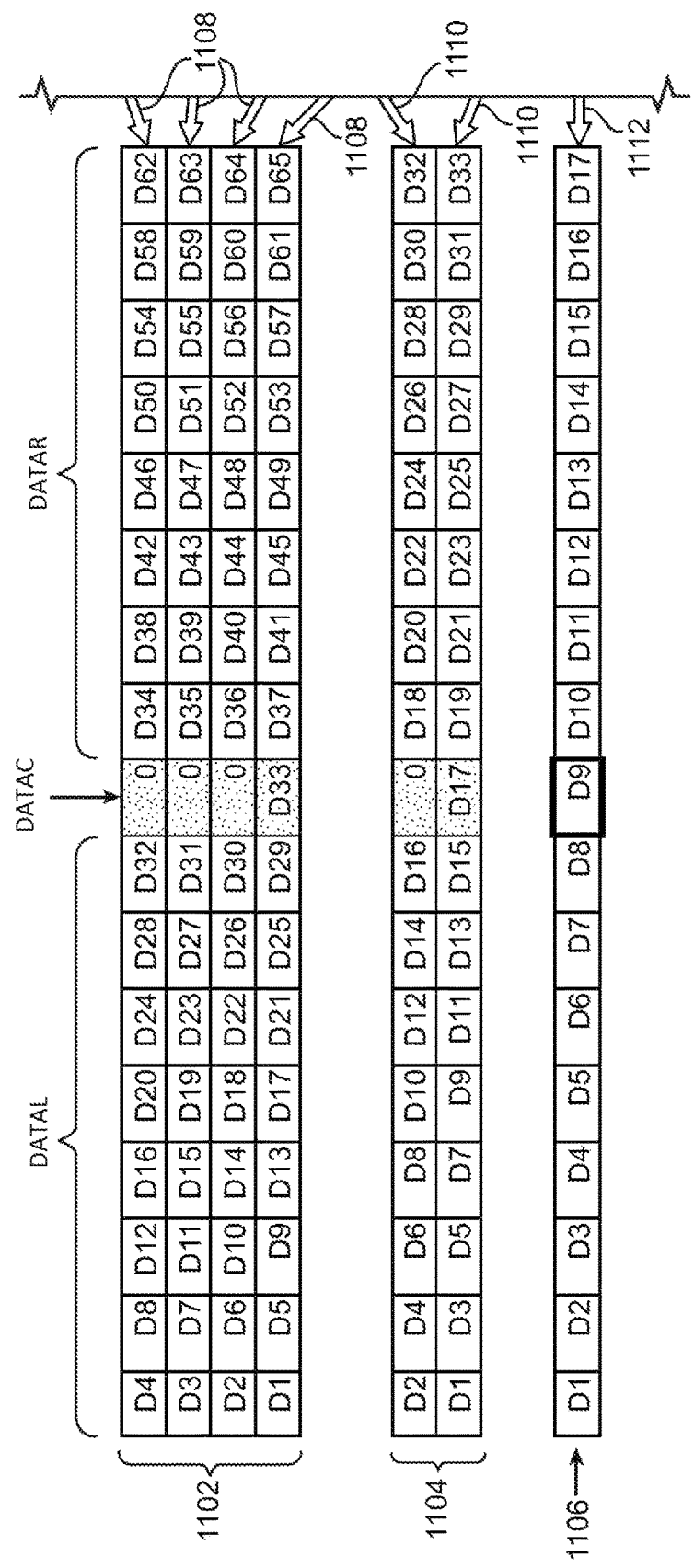
FIG. 11 is an illustrative diagram showing how address control circuitry may control convolving circuitry to perform decimation filtering using different selected decimation ratios in accordance with an embodiment of the present invention.
Figure 11:
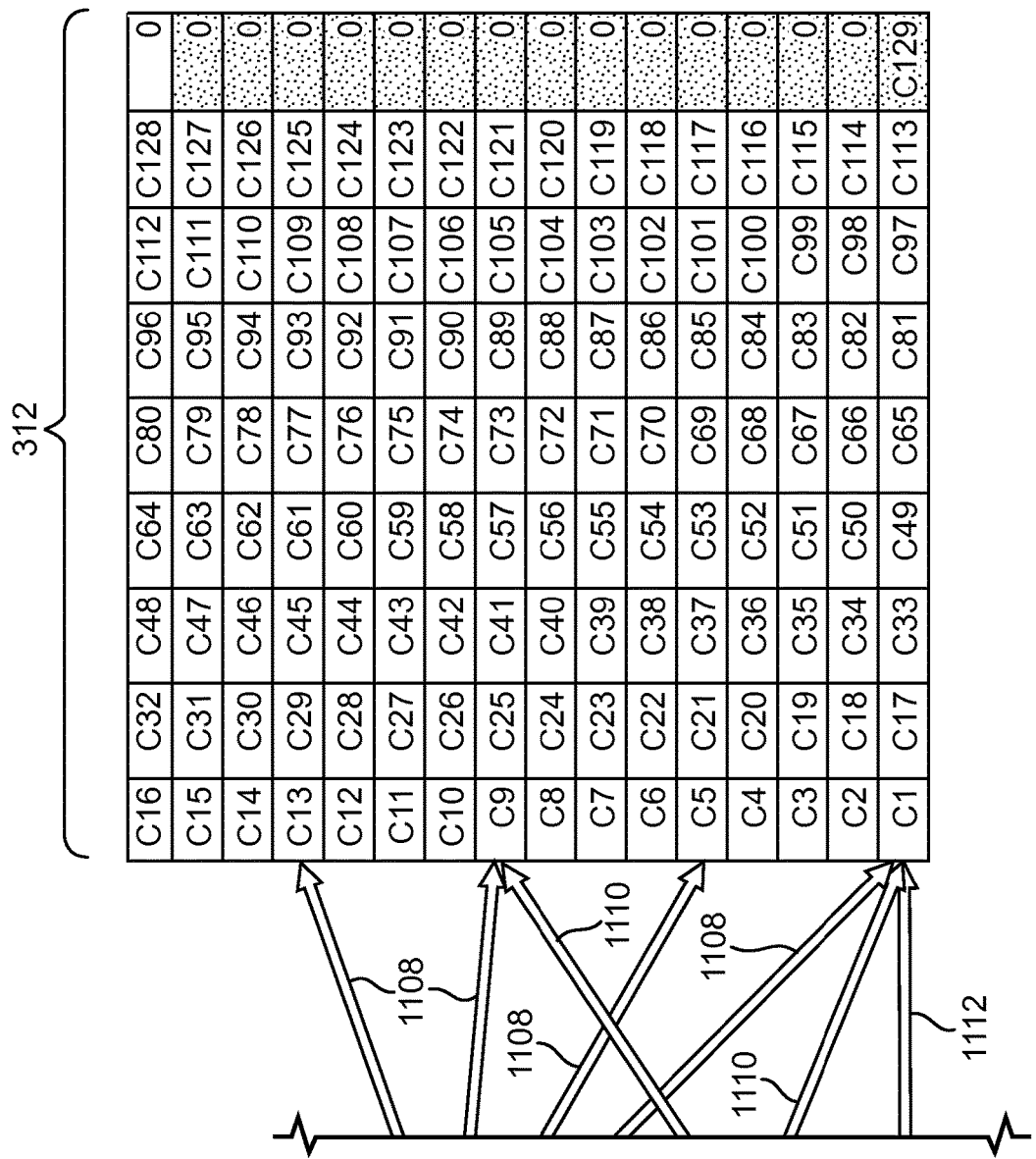

FIG. 11 is an illustrative diagram showing how filtering circuitry 212 may perform decimation filtering with 4:1, 2:1, and 1:1 decimation ratios. As shown by portion 1102, data elements D1-D32 may be stored on first buffer 402 and read as data portion DATAL whereas data elements D34-D65 are stored on second buffer 404 and read as data portion DATAR in four rows for performing filtering with a 4:1 decimation ratio. Elements stored on buffers 402 and 404 may be pre-added based on the symmetry about center data 805 and convolved with four rows of coefficients 312 as shown by arrows 1108 (e.g., with every fourth row of coefficients 312 or any other four rows of coefficients 312).

As shown by portion 1104, data elements D1-D16 may be stored on first buffer 402 whereas data elements D19-D33 may be stored on second buffer 404 in two rows for performing filtering with a 2:1 decimation ratio. Elements stored on buffers 402 and 404 may be pre-added based on the symmetry about center data 805 and convolved with two rows of coefficients 312 as shown by arrows 1110 (e.g., with every eighth row of coefficients 312 or any other pair of rows of coefficients 312).

As shown by portion 1106, data elements D1-D8 may be stored on first buffer 402 whereas data elements D10-D17 may be stored on second buffer 404 in a single row for performing filtering with a 1:1 decimation ratio. Elements stored on buffers 402 and 404 may be pre-added based on the symmetry about center data 805 and convolved with a single row of coefficients 312 as shown by arrow 1112 (e.g., with the first row of coefficients 312 or any other row of coefficients 312). Address control circuitry 208 may control memory 306 so that desired coefficients are provided to convolving circuitry 500 to perform filtering with a desired decimation ratio.

The examples of FIGS. 8-11 are merely illustrative. In general, any desired number of rows and columns may be used to store received data for convolving with symmetric coefficients 312. If desired, portions of buffers 402-406 may be reserved for storing data in additional data channels. In general, filtering circuitry 212 may experience the same workload regardless of which decimation ratio is selected. Each decimation ratio may use the same hardware on filter 212, as address control circuitry 208 may control memory 306 to provide a desired subset of stored coefficients to circuitry 304 for performing decimation with a desired decimation ratio. Filtering circuitry 212 may thereby achieve different decimation ratios dynamically using the same hardware resources and half the number of multipliers associated with asymmetric coefficient decimation filters.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Decimation filter circuitry, comprising:
   data buffer circuitry that receives and reorders first and second portions of a data stream in respective first and second buffers, wherein the first portion of the data stream is loaded in the first buffer according to a first ordering, and wherein the second portion of the data stream is loaded in the second buffer according to a second ordering that is different from the first ordering;
   pre-adder circuitry that is adapted to receive the reordered first and second portions of the data stream and to add corresponding data samples from the reordered first and second portions of the data stream to generate a plurality of pre-added values;

memory that is configured to store a plurality of decimation filter coefficient values;

address control circuitry that is configured to identify a selected decimation ratio and a selected subset of the plurality of decimation filter coefficient values corresponding to the selected decimation ratio; and dot-product circuitry, the address control circuitry being configured to control the memory to provide the selected subset of the plurality of decimation filter coefficient values to the dot-product circuitry, and the dot-product circuitry being configured to generate filtered output data by convolving the plurality of pre-added values with the selected subset of the plurality of decimation filter coefficient values provided by the memory.

2. The decimation filter circuitry defined in claim 1, wherein the pre-adder circuitry adds a first data sample from the first portion with a first data sample from the second portion to generate a first pre-added value and adds a second data sample form the first portion with a second data sample from the second portion to generate a second pre-added value.

3. The decimation filter circuitry defined in claim 2, wherein the dot-product circuitry comprises:

multiplier circuitry that generates a first multiplied value by multiplying the first pre-added value by a first decimation filter coefficient value of the plurality of decimation filter coefficient values and that generates a second multiplied value by multiplying the second pre-added value by a second decimation filter coefficient value of the plurality of decimation filter coefficient values.

4. The decimation filter circuitry defined in claim 3, wherein the dot-product circuitry further comprises:

summing circuitry that generates a summed value by summing the first and second multiplied values.

5. The decimation filter circuitry defined in claim 4, further comprising:

adder circuitry that adds a selected one of a logic "0" value and a data sample from a third portion of the data stream to the summed value.

6. The decimation filter circuitry defined in claim 5, wherein the data stream comprises a plurality of data stream phases, further comprising:

accumulator circuitry that generates accumulated filtered output data by accumulating the summed value and additional summed values each corresponding to a respective one of the plurality of data stream phases.

7. The decimation filter circuitry defined in claim 1, wherein the first and second buffers comprise respective first and second sets of columns, and wherein the decimation filter circuitry further comprises:

data buffering circuitry that receives the data stream and partitions the data stream into the first and second portions, wherein the first ordering fills the first set of columns in the first buffer in a first direction, and wherein the second ordering fills the second set of columns in the second buffer in a second direction that is opposite the first direction.

8. The decimation filter circuitry defined in claim 7, wherein the data buffering circuitry comprises:

a first data buffer circuit;

a second data buffer circuit; and a center data buffer circuit interposed between the first and second data buffer circuits.

9. The decimation filter circuitry defined in claim 8, wherein the first, second, and center buffer circuits format and reorder the data stream so that the first and second portions of the data stream are aligned with the plurality of decimation filter coefficient values.

10. A decimation filter operable to receive a data stream, the decimation filter comprising:

a first buffer circuit configured to store and format a first portion of the received data stream;

a selector circuit;

convolving circuitry coupled to an output of the selector circuit, the first buffer circuit being configured to convey the stored first portion of the received data stream to the convolving circuitry via the selector circuit;

a center buffer circuit configured to re-order a second portion of the received data stream;

a second buffer circuit, the center buffer circuit being interposed between the first and second buffer circuits and the second buffer circuit being configured to store and format the re-ordered second portion of the received data stream, wherein the stored re-ordered second portion of the received data stream exhibits a symmetry about the center buffer circuit with respect to the stored first portion of the received data stream; and a combining circuit, wherein the first buffer circuit is configured to convey the stored first portion of the received data stream to the convolving circuitry via the combining circuit and the selector circuit.

11. The decimation filter defined in claim 10, wherein the convolving circuitry is configured to generate a filtered data output by convolving the stored first portion and the stored reordered second portion of the received data stream with a plurality of filter coefficient values based on the symmetry, wherein the received data stream has a first sample rate and the filtered data output has a second sample rate that is less than or equal to the first sample rate.

12. The decimation filter defined in claim 11, wherein the convolving circuitry comprises pre-addition circuitry that adds data samples from the stored first portion of the received data stream with corresponding samples from the stored reordered second portion of the received data stream based on the symmetry.

13. The decimation filter defined in claim 10, further comprising:

an additional combining circuit; and an additional selector circuit, wherein the second buffer circuit conveys the stored re-ordered second portion of the received data stream to the convolving circuitry via the additional combining circuit and the additional selector circuit.

14. The decimation filter defined in claim 10, further comprising:

an additional selector circuit; and a multiplexing circuit, wherein the first buffer circuit conveys a third portion of the received data stream to the convolving circuitry via the combining circuit, the additional selector circuit, and the multiplexing circuit.

15. The decimation filter defined in claim 14, wherein the convolving circuitry further comprises adder circuitry, wherein the adder circuitry adds the third portion of the received data stream to the filtered data output.

16. The decimation filter defined in claim 10, wherein the first buffer circuit has a first input and a first output, the center buffer circuit has a second input and a second output, and the second buffer circuit has a third input and a third output, further comprising:

a first additional selector circuit coupled between the first output and the second input;

a second additional selector circuit coupled between the first output and the first input; and a third additional selector circuit coupled between the third output and the third input.

17. A decimation filter operable to receive a data stream, the decimation filter comprising:

a first buffer circuit having a first set of memory columns configured to store and format a first portion of the received data stream by filling the first set of memory columns with the first portion of the received data stream in a first direction;

a center buffer circuit configured to re-order a second portion of the received data stream;

a second buffer circuit having a second set of memory columns, the center buffer circuit being interposed between the first and second buffer circuits and the second buffer circuit being configured to store the re-ordered second portion of the received data stream by filling the second set of memory columns with the second portion of the received data stream in a second direction that is opposite the first direction, wherein the stored re-ordered second portion of the received data stream exhibits a symmetry about the center buffer circuit with respect to the stored first portion of the received data stream; and a selector circuit that is configured to receive a set of bits, to generate an output that includes a subset of the set of bits, and to provide the subset of the set of the bits to the second buffer circuit.

18. The decimation filter defined in claim 17, wherein the first buffer circuit has an input and an output and the selector circuit is coupled between the input of the first buffer circuit and the output of the first buffer circuit.

19. The decimation filter defined in claim 17, wherein the second buffer circuit has an input and an output and the selector circuit is coupled between the input of the second buffer circuit and the output of the second buffer circuit.

20. The decimation filter defined in claim 17, wherein the first buffer circuit has a first input and a first output, the center buffer circuit has a second input and a second output, and the selector circuit is coupled between the first output and the second input.

21. The decimation filter defined in claim 20, further comprising:

an additional selector circuit coupled between the first input and the first output.

22. The decimation filter defined in claim 20, wherein the second buffer circuit has a third input and a third output, the decimation filter further comprising:

a first additional selector circuit coupled between the third input and the third output.

23. The decimation filter defined in claim 22, further comprising:

a second additional selector circuit coupled between the first input and the first output.

* * * * *